US009148278B1

(12) United States Patent
Ray et al.

(10) Patent No.: US 9,148,278 B1
(45) Date of Patent: Sep. 29, 2015

(54) DIGITAL FREQUENCY SYNTHESIS

(71) Applicant: Nokia Solutions and Networks Oy, Espoo (FI)

(72) Inventors: Dale Ray, Fort Worth, TX (US); William Walsh, Wilmington, NC (US)

(73) Assignee: Nokia Solutions and Networks Oy, Espoo (FI)

( * ) Notice: Subject to any disclaimer, the term of this patent is extended or adjusted under 35 U.S.C. 154(b) by 0 days.

(21) Appl. No.: 14/325,784

(22) Filed: Jul. 8, 2014

(51) Int. Cl.
*H04L 7/033* (2006.01)
(52) U.S. Cl.
CPC .................................. *H04L 7/0331* (2013.01)
(58) Field of Classification Search
CPC .......................... H03L 7/00–7/04; H03L 7/08
USPC ........................... 375/354–375; 327/141–147
See application file for complete search history.

(56) References Cited

U.S. PATENT DOCUMENTS

| 7,782,147 | B2 | 8/2010 | Anderson et al. ................. 331/69 |
| 8,829,957 | B1 * | 9/2014 | Fluegel et al. ................. 327/146 |

OTHER PUBLICATIONS

Taylor, D. et al.; "All Digial VCXO Replacement for Gigabit Transceiver Applications"; XAPP589 (v2.1); Oct. 15, 2013; pp. 1-29; XILINX.

* cited by examiner

*Primary Examiner* — Vineeta Panwalkar
(74) *Attorney, Agent, or Firm* — Harrington & Smith

(57) ABSTRACT

Systems and techniques for oscillator control are described. A fixed or controlled oscillator feeds a plurality of evenly spaced tap points multiplexed to an output by a multiplexer. A phase change control circuit changes the multiplexer to a new tap point one phase tap at a time, with the change being made when an oscillator clock edge will not be repeated to an output. The phase change control circuit determines when to change the multiplexer setting based on the overflow of an accumulator, which is continuously summing an increment value. The sign of the accumulator increment value determines the direction of the multiplexor updates. The resulting output signal from the multiplexor is a new output frequency related to the oscillator frequency and the accumulator increment value. With a plurality of multiplexer controlled outputs and corresponding phase change control circuits, a plurality of output frequencies can be created from one oscillator.

22 Claims, 6 Drawing Sheets

DIGITAL FREQUENCY SYNTHESIS

TECHNICAL FIELD

The present invention relates generally to oscillator output control. More particularly, the invention relates to improved systems and techniques for phase adjusting an oscillator output to achieve control of oscillator output frequency and phase.

BACKGROUND

Numerous devices need a source of a reliable, precise frequency to carry out their functions. The functions of a device often involve synchronous operation with other devices, synchronization of functions within the device itself, precise timekeeping, and numerous other operations involving the use of a precise frequency. Today, quartz oscillators are in wide use for precise frequency generation. Such oscillators come in many configurations, from simple crystal oscillators to double oven quartz oscillator designs. Such designs cover a wide range of frequencies and stabilities. In configurations designed for high performance, the oscillator performance is determined by the physics of the quartz resonator, the supporting circuit around the quartz resonator, and environmental factors. At the system level, factors affecting overall oscillator and synchronization stability include temperature changes, supply voltage changes, aging rates, steering linearity and gain variations, analog control voltage drift, and numerous other factors. Developments of new devices and needs to provide efficient service in many applications are driving demands for better and better synchronization performance. Equipment manufacturers naturally wish to provide synchronization performance without resorting to excessively expensive techniques for frequency generation.

SUMMARY

In one embodiment of the invention, an apparatus comprises a phase locked loop oscillator circuit. The phase locked loop oscillator circuit comprises an oscillator generating a frequency output based on an input signal. The frequency output is fed to a plurality of evenly phase spaced output tap points. The phase locked loop oscillator circuit further comprises a phase frequency detector supplying the input signal to the oscillator, wherein the input signal indicates the error based on the difference between an input clock signal and the feedback signal; a plurality of output multiplexers each driven by the plurality of the tap points, wherein each of the plurality of output multiplexers can be selected as an oscillator output or used as a feedback signal; and a plurality of phase change control circuits, each determining a phase change command to change a specified output multiplexer to a new tap point by adjusting the specified multiplexer one phase tap at a time, with the change being made when an oscillator clock edge will not be repeated to an output, wherein each of the plurality of phase change control circuits determines a phase change command by summing a phase increment at each of a plurality of accumulator clock cycles to compute an accumulated phase increment over the plurality of accumulator clock cycles and, when the maximum accumulated phase increment value is exceeded, decreasing the accumulated phase increment value by the maximum phase increment value and delivering the phase change command specifying the direction of the phase change, and wherein the phase change commands delivered by the plurality of phase change control circuits are queued for delivery.

In another embodiment of the invention, a method comprises generating an oscillator frequency output based on an input signal. The frequency output is fed to a plurality of evenly phase spaced output tap points. The method further comprises supplying the input signal to an oscillator, wherein the input signal is an error signal based on the difference between an input clock signal and the feedback signal; multiplexing a plurality of outputs each driven by a plurality of the tap points, wherein each of the output multiplexers can be selected as an oscillator output or a feedback signal; determining a plurality of phase change commands and queueing the phase change commands for selection, each phase change command changing a specified output multiplexer to a new tap point by adjusting the specified multiplexer one phase tap at a time, with the change being made at a time when an oscillator clock edge will not be repeated to an output. Determining each phase change command comprises computing an accumulated phase increment by summing a phase increment value over a plurality of accumulator clock cycles until a maximum accumulated phase increment value is exceeded. When the maximum accumulated phase increment value is exceeded, the accumulated phase increment value is decreased by the maximum phase increment value and the phase change command is delivered, with the phase change command specifying the direction of the phase change.

DETAILED DESCRIPTION

Embodiments of the present invention address mechanisms to achieve improved oscillator performance using standard, inexpensive quartz oscillator designs. Temperature variations are a significant source of instability in quartz oscillator designs, and the replacement of oscillator components that are susceptible to temperature variations would allow improvement in the performance of the overall oscillator. Embodiments of the present invention are guided in part by recognition that a steering varactor, used in ovenized quartz oscillator designs are subject to substantial temperature dependence. Tests conducted by the inventors have shown that removal of the steering varactor may provide a doubling of thermal stability. One or more embodiments of the present invention provide inexpensive mechanisms to serve the same function as the steering varactor. The steering varactor allows for alteration of a crystal resonant frequency, thus allowing adjustment of the oscillator frequency. An inexpensive approach to replacing the oscillator steering function is the use of dynamically changeable phase/delay taps. Such taps were originally designed to allow for the resolution of internal timing problems affecting high speed serial links and digital designs, but in one or more embodiments of the present invention, such taps are used with a controller to enable frequency shifting by controlling the rate of phase changes.

Figure 1:
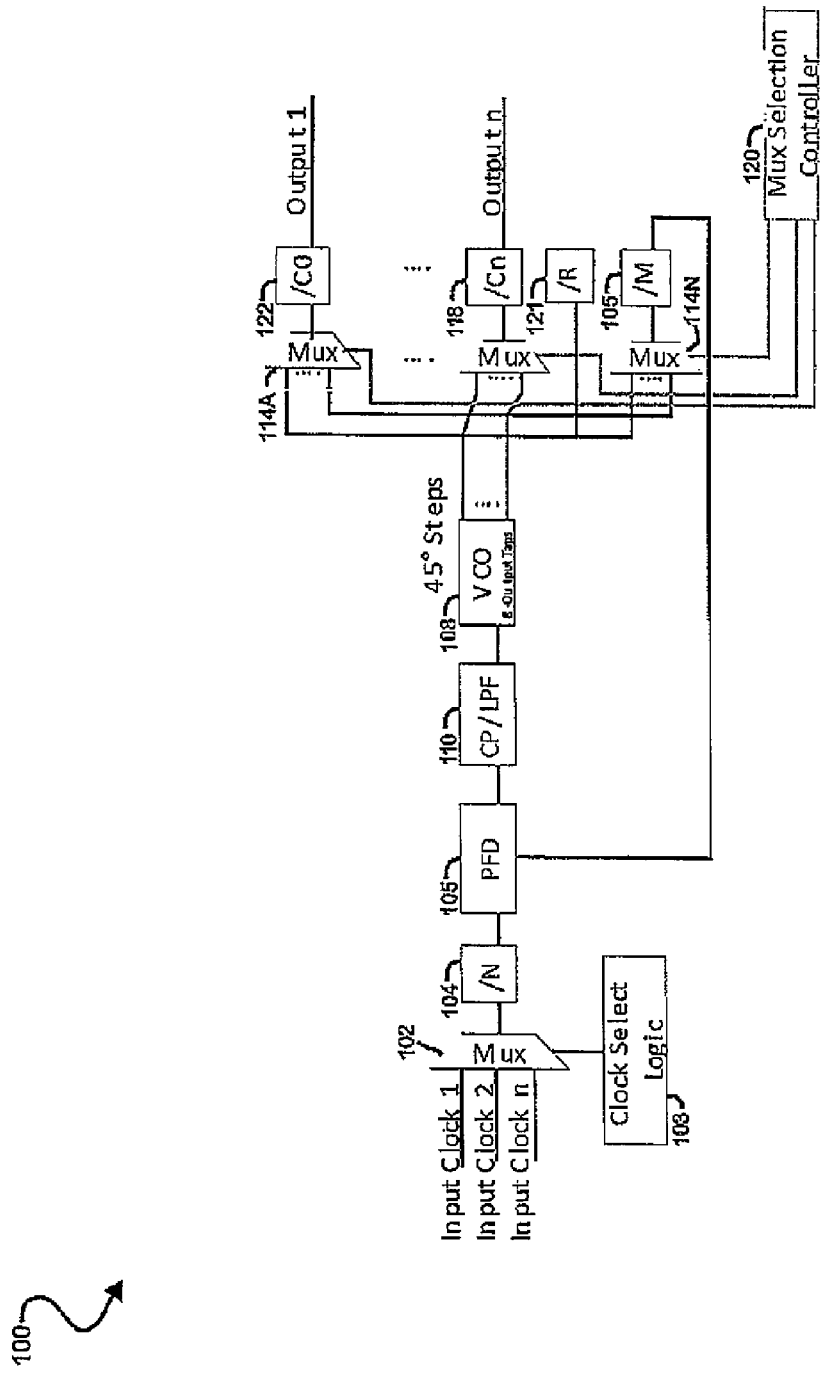
FIG. 1 illustrates a phase locked loop circuit adapted for use in embodiments of the present invention.

FIG. 1 illustrates a phased lock loop 100 with multiple outputs, with a voltage control oscillator (VCO) employing multiple uniformly spaced output taps—in the present example, an 8 output tap design. In this design, each of the eight VCO clock tap points is uniformly distributed through one VCO clock period. These VCO tap points are connected to multiple clock outputs through selection multiplexors (114), allowing clock outputs to be individually driven from one of the selected VCO tap points. In addition, this design provides mechanisms allowing a multiplexer to be dynamically changed to a new tap point, thus enabling a 1/8 VCO Clock cycle phase advance or phase delay on an individual clock output. A voltage controlled oscillator is illustrated in the various figures and discussed below by way of example, but it will be recognized that embodiments of the invention are not limited to the use of a voltage controlled oscillator, and that any suitable oscillator control mechanism may be employed, and some embodiments of the invention can be implemented with a fixed frequency oscillator.

An input multiplexer 102 selects a clock input, which is divided down by an /N divider 104 to create an input clock stream to a phase frequency detector (PFD) 105. The PFD (Phase Frequency Detector) compares its two inputs (from the N divider 104 and an M divider 106) and generates a signal that indicates if the "N" input is leading or lagging the "M" input. If the "N" input is leading, then the "M" signal needs to speed up to be aligned with the "N" input. The PFD 105 effects this change by increasing or decreasing the voltage that is applied to a voltage controlled oscillator (VCO) 108, but first the PFD signal is filtered in a Charge Pump/Low Pass Filter (CP/LPF) block 110. The CP/LPF smoothes the PFD output so that the VCO output changes are more gradual. The VCO 108 has an output frequency proportional to the input voltage applied. The output of the VCO 108 can range in frequency from the MHz into the GHz range. The output(s) of the VCO 108 are fed to multiplexers 114A, . . . , 114N, with a multiplexer selection controller 120 directing each individual mutiplexer to connect one of the VCO tap points to the associated Clock Outputs. The VCO clock output is divided down by the individual C, R and M dividers 118, 120, and 106, respectively, to yield output clocks to other circuits or the feedback clock (M) back to the PFD 105. The end result is that the final output clock frequency for each clock output is $f_{out}=f_{in}*M/(N*C)$.

In one or more embodiments, the invention employs a phase controlled frequency adjustment control circuit 200, incorporating the output phase selection phase locked loop 100. In one or more embodiments of the invention, the phase adjustment control circuit 200 comprises a plurality of phase change control circuits 202A, . . . , 202N, one for each of the multiplexers 114A, . . . , 114N, but as discussed below, the phase adjustment control circuit may comprise a single phase change control circuit. The multiplexer selection controller receives command requests to change a specific output multiplexer to a new VCO tap point, by adjusting the specified multiplexer one phase tap at a time, and making the change when a VCO clock edge is not going to be repeated to the output divider. If a multiplexer on a clock output path is changed at a fixed rate, then the average output clock frequency would be adjusted up or down, or if the multiplexer were moved a fixed number of steps, the output clock would accumulate a fixed amount of phase advancement or delay. The circuit 200 provides, with each phase change control circuit, the controls needed to determine when to change the phase of an output clock to yield the desired output clock characteristics. Changing the output phase every $N^{th}$ clock period would result in a 1/x response providing a very coarse granularity at high adjustment rates and fine granularity at low offset frequencies. Each of the circuits 202A, . . . , 202N linearizes the response so that frequency adjustment is linear and has a fixed 1 significant bit step size across the entire adjustment range. Each circuit 202A, . . . , 202N operates by summing an input adjustment amount every accumulator clock cycle (#) until the most significant bit sets, or the carry bit asserts. The carry bit is not passed back into the summer; rather, only the lower n−1 bits are sent back to the summer. The result is that every X seconds a phase update is made, as opposed to 1/x seconds if clock cycles were directly counted. In these specific circuits, the most significant bit of the Phase Increment input value is used as a sign bit to determine the sign of the frequency adjustment. Looking at the specific configuration presented here, it can be determined that the output frequency of an adjusted clock output is offset from the unadjusted frequency according to the equation: $\Delta F_{out}=(F_{accumulator\_clk}*\text{Phase Increment})/(F_{vco}*\text{number of taps}*2^{\text{Phase\_Increment\_Bits}})$. A close look at this result reveals that the adjustment resolution can be very small and provide a significant adjustment range.

For the specific circuit 200, the least significant bit step size is determined by: $F_{acculator\_clk}=20$ MHz, $F_{vco}=1.28$ GHz, # of taps=8, 31 Phase Increment bits, gives a least significant bit (LSB) resolution=20E6*1/(1.28 G*8*2^31)=909.4947E-15 parts. The result is a circuit that has a linear control response with a uniform ~0.909 part per trillion frequency change for each adjustment step. In this example circuit, the maximum frequency adjustment is 2^31−1*LSB resolution=+/−1953 ppm, which results in the multiplexer updating at a rate essentially as fast as the accumulator clock rate.

Combining the circuit 200 with the PLL 100 creates and solves an additional problem; namely, close-in phase noise spurs. Phase adjustments and frequency modulation of a clock signal create harmonics and side lobes that can be too close to the fundamental carrier frequency, so that downstream filter circuits are ineffective. The solution to this problem is to avoid generating phase adjustments at a low rate, which would create phase noise spurs that are close to the fundamental clock frequency. This issue is not a concern if the adjustment amount is large; however, if the output clock only needs to be shifted in frequency a small amount, then difficulties arise. A mechanism for overcoming such difficulties can be developed based on the recognition that a small adjustment amount can be realized by the difference of two large adjustment amounts, where $F_{final}=F_1-F_2$.

If $F_1$ and $F_2$ have a frequency offset that does not affect the driven circuits or can be easily filtered, then the close-in phase noise spur problem is avoided. The optional logic circuits 204A, . . . , 204N allow the creation of the $-F_2$ frequency, and the circuits 202A, . . . , 202N create the $F_1$ frequency. The $F_1$ frequency is set so that $F_1=F_{adjust}+F_2$, and F2 is set to a value outside the frequency of concern, the final result is $F_{final}=F_{adjust}+F_2-F_2=F_{adjust}$. If the filter band is fixed, then the $F_2$ value can be calculated and left as a static value. The F2 frequency may be calculated using the $\Delta F_{out}$ equation above: ($\Delta F_{out}=(F_{accumulator\_clk}*\text{Phase Increment})/(F_{vco}*\text{number of taps}*2^{\text{Phase\_Increment\_Bits}})$, and the result is loaded into the circuit via the Offset value in circuits 204A-204N. The desired output clock frequency adjustment value is calculated as before using the equation $\Delta F_{out}$, and the result is loaded into the circuit via the Phase Increment value in circuits 202A-202N. The F1 value is created in the circuit by the summation of the Offset and Phase Increment values. The F2 frequency is made negative by the phase step direction always being the opposite of the sign value loaded in the Phase Increment value. The Offset value does not have a sign control bit.

As illustrated here, the summation circuits can be implemented on a per clock output basis, allowing individual output tuning capability. It will be recognized that rather than providing multiple components 202A, . . . , 202N and 204A, . . . , 204N, a single component of each type can be used, to tune a combined output rather than each individual output. In that case, only a circuit 202A, optionally combined with a circuit 204A, would need to be used.

The remaining element of the phase control circuit 200 is an output command first input first output (FIFO) queue 206. An examination of the circuit 200 reveals that multiple phase step output commands could be asserted in one accumulator clock cycle. The FIFO queue 206 captures all the step commands and directions that can occur in a single clock cycle and allows them to be processed by the multiplexer selection controller sequentially. Each phase step/direction and offset step/direction is associated to a specific output clock and placed into the FIFO. The FIFO is designed to allow multiple commands to be entered into the FIFO queue in one Accumulator Clock cycle. The FIFO queue 206 can be tens of commands deep, to match the peak rate of step commands being issued by circuits 202A-N, 204A-N to the step command processing rate of the multiplexing selection controller. The additional inputs to the command FIFO (206), Phase Adjustment State Machine Inputs, allow for other circuits to precisely adjust an individual output clock phase in single phase adjustment steps.

Compared to oven controlled crystal oscillator (OCXO) and digital to analog conversion (DAC) circuits, the benefits of an approach such as that detailed above are readily apparent. The following table presents a comparison of digital frequency synthesis (DFS) according to embodiments of the current invention to conventional approaches:

| Parameter | Varactor + DAC | DFS |
|---|---|---|
| Control Resolution | Max 20-24 bits | No Hard Limit, >31 bits |
| Linearity Error | Few % to 10% | None |
| Pull Range | OCXO 100 to 1000 ppb | >2000 ppm possible |
| Pull Range Symmetric | Varies over life of oscillator | + & − adjustment is equal |
| Gain Variation | 2X to 3X part to part variation | Fixed by Design |
| Independently Adjustable Outputs | 1 | Many |
| Make a specific phase adjustment | PFD Granularity | Sub-PFD Granularity |

With these improvements, and wider control ranges it become apparent that the oscillator performance specifications can be relaxed and still provide the same system functionality. The most obvious relaxation is the nominal frequency of the oscillator. For a precision reference oscillator the nominal output frequency is typically constrained to a few 10s of ppb to allow for a 10 year or longer operational life. Using approaches described above, the nominal output frequency of the oscillator can be 1000's of ppb in error and still not impact the operation life of the oscillator. This is significant because it enables the removal of fine plating and/or fine etching steps of a crystal blank in a crystal resonator, enabling a path to crystal oscillator cost reductions through the removal of processing steps. There is some evidence that suggests that removing these steps will also improve overall crystal stability.

Embodiments of the present invention also allow for simplification of the system phase locked loop, primarily because the oscillator control gain is now fixed and known. An immediate shift to a new operating frequency can be achieved, as opposed to having to converge on the new operating point, or having to learn and calibrate the specific oscillator control gains. As an example, if it is known that the frequency error is 10 Hz, this frequency error can be converted mathematically into a required control value change, without the traditional individual specific circuit uncertainties. In another example, if it is known that a system timing error is 500 nS, then precisely 500 nS of phase change can be inserted at a known frequency offset as quickly as possible, while still meeting all system performance limits. As an example, 500 nS of error can be removed in 10 seconds without altering the output frequency more than 50 ppb. Such an adjustment could not be done with a traditional phase locked loop with a 2× to 3× variation in the oscillator control gain.

Figure 2:
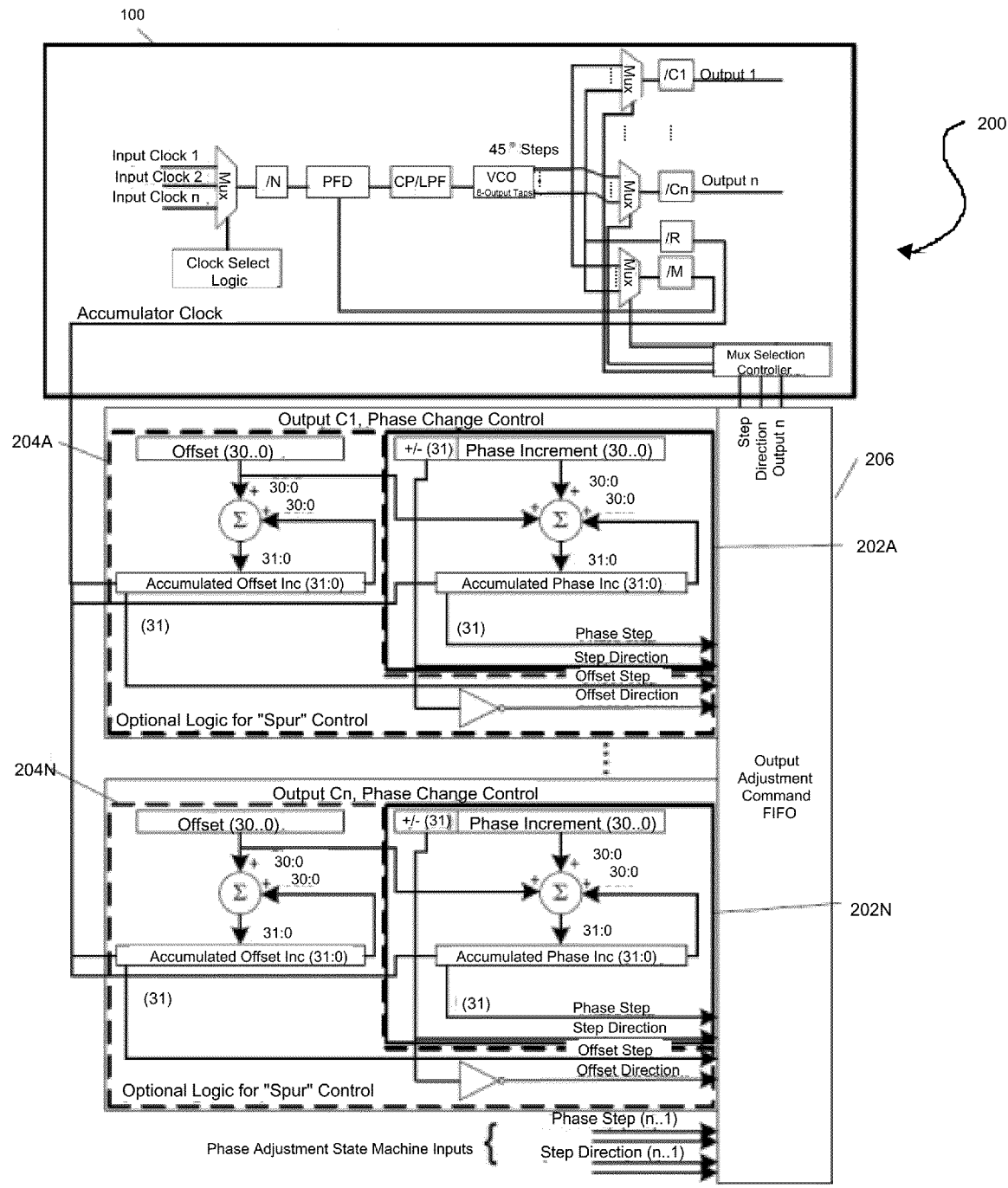
FIG. 2 illustrates a phase controlled frequency adjustment circuit according to an embodiment of the present invention.
Figure 3:
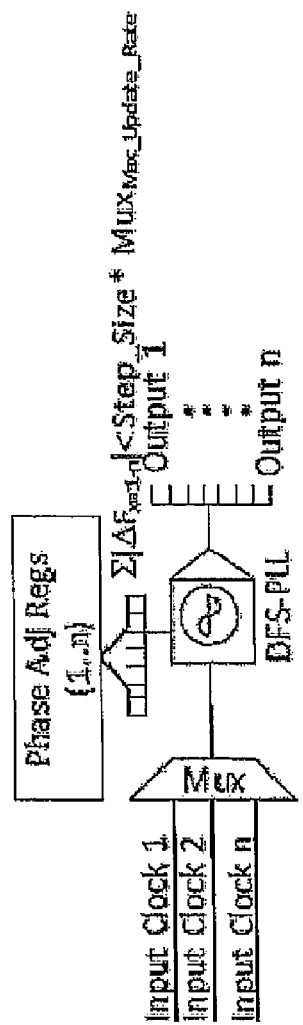
FIG. 3 illustrates an alternative view of the circuit of FIG. 2.

FIG. 3 illustrates a phase controlled frequency adjustment circuit 300 similar to that of FIG. 2, with elements in reduced and a consolidated form in order to allow more convenient presentation of additional elements and features.

Figure 4:
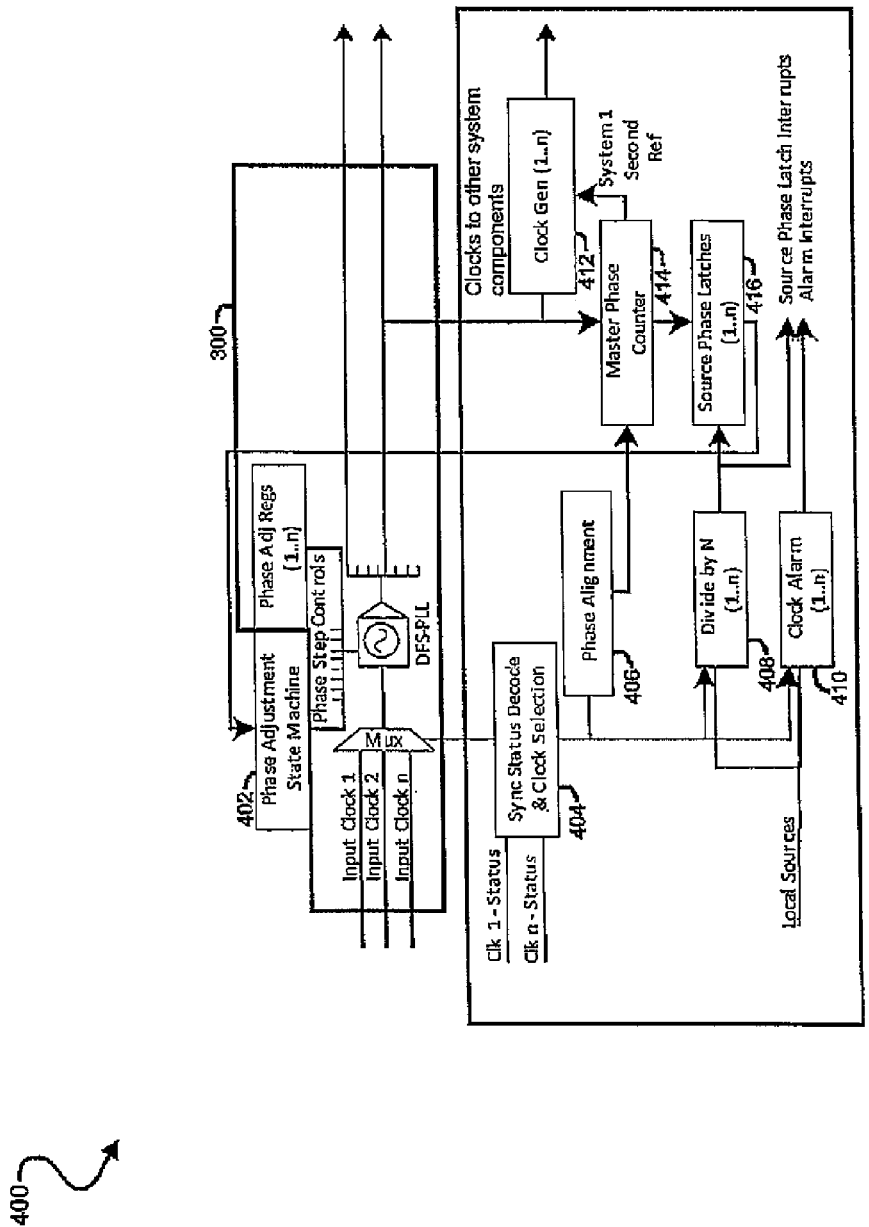
FIG. 4 illustrates an enhanced phase controlled frequency adjustment circuit control circuit according to an embodiment of the present invention.

FIG. 4 illustrates an enhanced phase controlled frequency adjustment circuit 400, incorporating the control circuit 300 as well as a redundant clock circuit including a state machine 402 and additional clock components, including a sync status decode and clock selection element 404, a phase alignment element 406, a divide by N divider 408, a clock alarm 410, a clock generator 412 providing clock signals to other system components, a master phase counter 414, and phase latches 416. The redundant clock circuitry allows for correction of phase errors that can occur when a clock fails without warning. The addition of the redundant clock circuit 400 adds to the digital frequency synthesis phase locked loop (DFS PLL) the a state machine 402, which uses input from the source phase latches 416 to measure the local time base error against the input clock and cleanly adjust the local time base to align with the input clock. Such a circuit may be implemented with a local timebase controlled by the master phase counter 414. The contents of the master phase counter are compared against a reference timing pulse from the system level timebase, and the error between these two are fed to a phase adjustment state machine 402 to compare the source phase latch value against the target value to determine the error. The phase adjustment state machine 402, using the determined error, provides step commands to the DFS-PLL to slightly adjust the local clock frequency thus moving the local master phase counter and timebase until they precisely align with the supplied system level reference clock. These step commands are provided through phase adjustment state machine inputs to the queue 206. The phase adjustment state machine can be programmed to step a number of phase steps in one comparison period, and then stop once the error reaches zero. This enables rapid and controlled alignment without the overshoot error which might be encountered in a more traditional approach. For example if the error signal to the Phase Adjustment state machine indicated a 25 nS error, and the maximum allowable correction frequency offset was 5 ppb, then the phase adjustment state machine could precisely issue 25 nS of step commands to the DFS-PLL at a rate that did not exceed the 5 ppb limit. This ability is very useful in removing accumulated phase errors when swapping clock references in redundant clock source systems.

Figure 5:
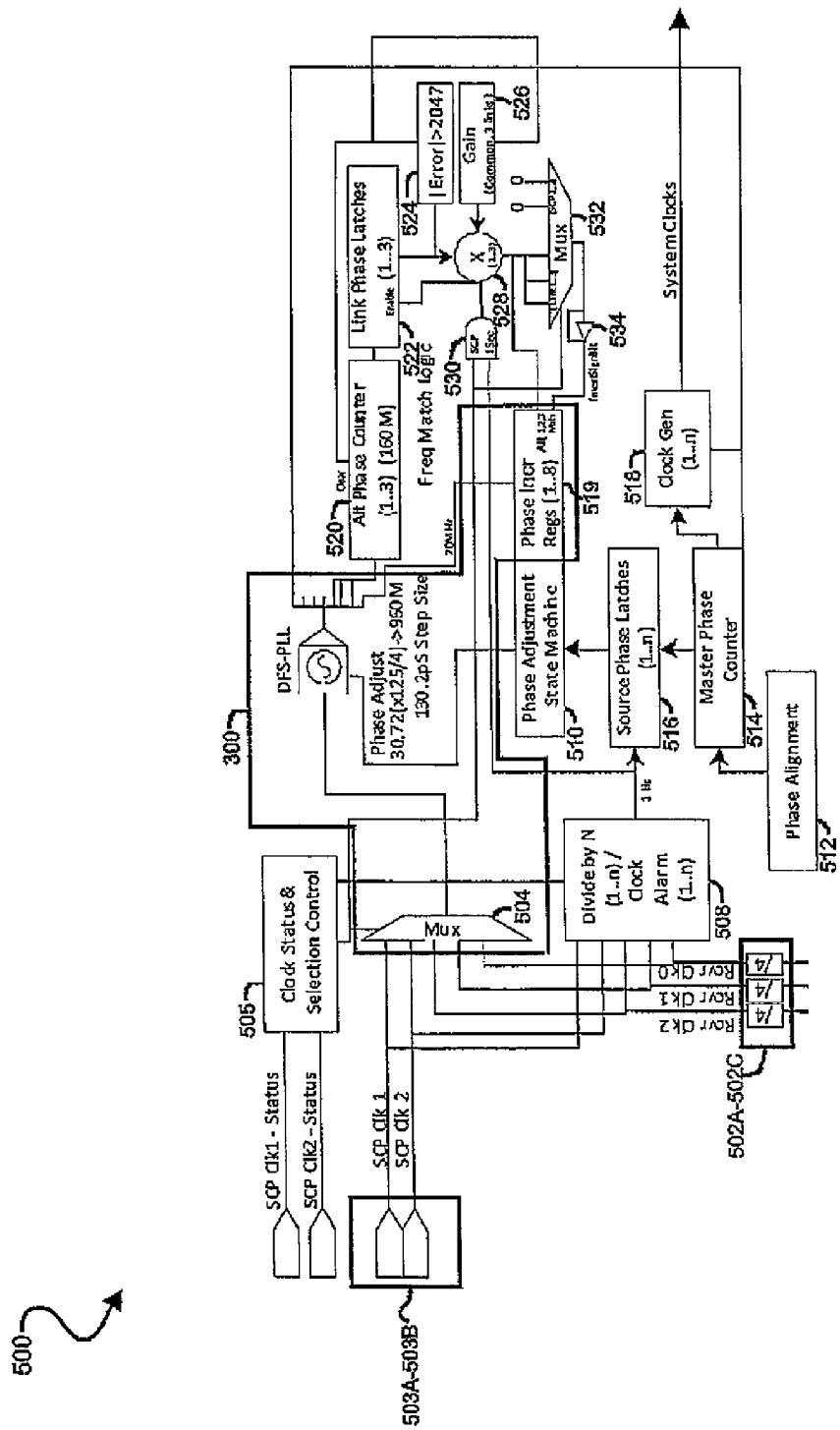
FIG. 5 illustrates an alternative enhanced phase controlled frequency adjustment circuit adjustment circuit according to an embodiment of the present invention.

FIG. 5 illustrates an alternative enhanced phase controlled frequency adjustment circuit 500, incorporating the circuit 300 and expanding on the elements of FIG. 4. The digital frequency synthesis circuits allow learning of the difference frequency between multiple reference clocks, and allow for the selection of reference clocks of different frequencies. In the illustrated embodiment, the accumulated phase error over a time period of an alternate clock compared to one of the DFS-PLL outputs is measured.

The circuit 500 comprises a plurality of alternative input reference clocks 502A-502C, which in the present exemplary embodiment are implemented as outputs of /4 dividers. These and main reference clock inputs 503A and 503B feed a multiplexer 504, which receives control signals from a clock status and selection control element 505. The circuit 500 also comprises a divide by N/clock alarm element 508 and a phase adjustment state machine 510. The phase adjustment state machine 510 receives phase alignment information from the source phase latches 516. The source phase latches 516 capture the contents of the master phase counter 514 upon the receipt of the reference pulse from each of the input references 503A-B, 502A-C. The master phase counter is incremented by the controlled output from the DFS-PLL in 300. The master phase counter also supplies a clock generator 518 which produces a plurality of system clock signal. The circuit 300 supplies a plurality of output clocks to a plurality of alternative phase counter(s) 520, which feeds link phase latches 522. There is a separate clock output from the DFS-PLL (300) and an alternative phase counter (520) and a Link Phase Latch 522 for each of the plurality of alternative input reference clocks 502A-502C. The alternative link phase latches 522 supply an error value which is multiplied 528 by a gain value 526. The result of the multiplication is passed to the Phase Increment Registers 519 and to selection multiplexer 532. The selection multiplexer 532 is set to pass the corresponding input value to the sign inverter 534 to the phase increment register corresponding to the main clock output. The phase increment registers 519 provide frequency error information to the phase adjustment state machine 510 which then issues phase adjustment commands to the DFS-PLL 300. The phase adjustment commands from the phase adjustment state machine 510 will cause the DFS-PLL clocks corresponding to the alternative input clocks 502A-502C to match the frequency of the alternative input clocks 502A-502C. The link phase latches 522 latch a new value from the alternative phase counters 520 when either of the main inputs clock are selected, as determined by AND gate 530, and at a periodic rate as determined by the divide by N logic 508 for each alternative clock input. The error block 524 is a plurality of comparators which individually will jump to zero the alternative phase counter 520 if the value latched by an individual link phase latch 522 is out of bounds, and thus needs to be realigned with the periodic pulse for each alternative input clock generated by divide by N block 508. The clock status and selection control module 505 also supplies the selection input of the multiplexer 532.

The error measurement is used to iteratively adjust the DFS-PLL output clock used for this comparison until the DFS-PLL output clock for this comparison matches the alternative input clock frequency. The result of this process is the discovery of the DFS-PLL control value that would allow the Alternate reference clock to be used in place of the currently selected reference clock, without altering the current System Reference clock frequency. When the current reference is lost, the learned difference frequency control value can be negated and immediately applied to the DFS-PLL main clock output control to allow the reference source to change frequencies without impacting the output System Reference clock, so long as the new reference is within the DFS-PLL adjustment range. This approach allows the use of stable but uncalibrated references as backup clock sources.

Figure 6:
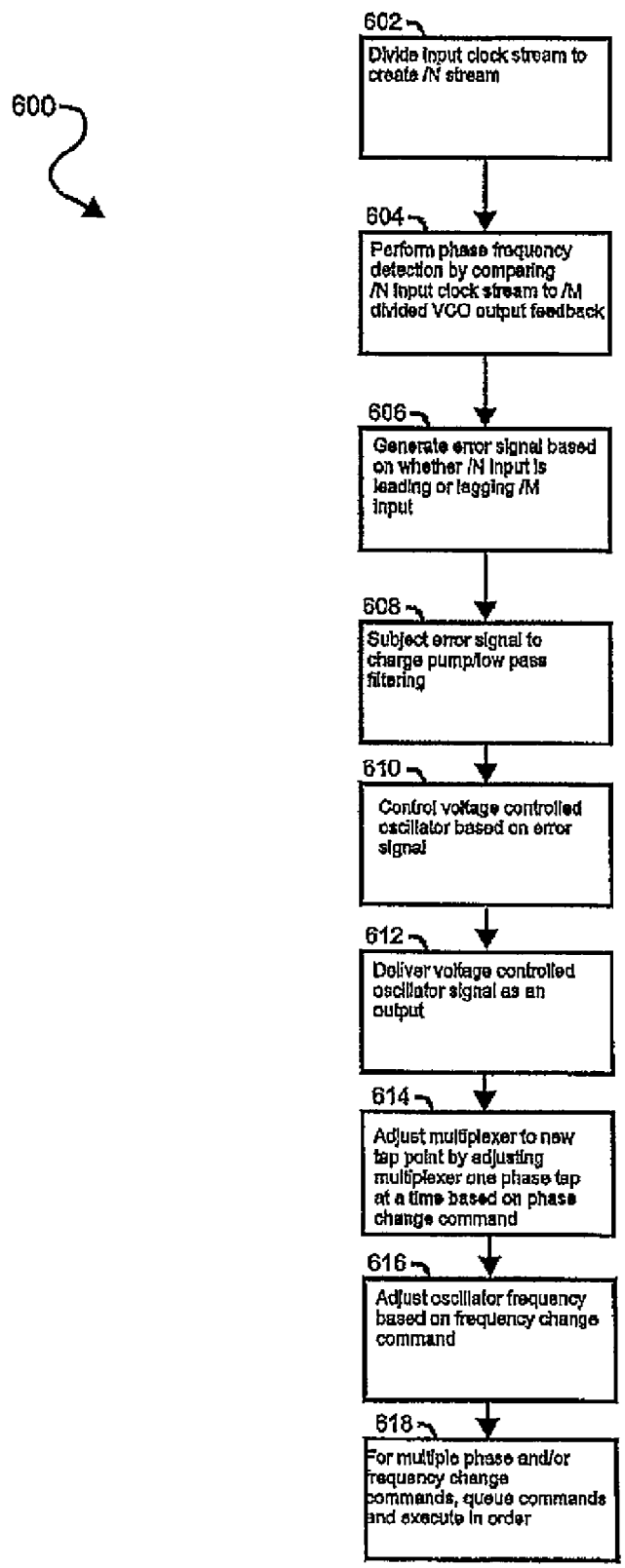
FIG. 6 illustrates a process according to an embodiment of the present invention.

FIG. 6 illustrates a process 600 according to an embodiment of the present invention. At block 602, an input clock stream is divided to create a /N stream. The input clock stream may be selected from a plurality of available input clock streams, which may be supplied to a multiplexer, with selection of one of the input clock streams being accomplished through control of the multiplexer. At block 604, phase frequency detection is performed, suitably by comparing the IN input clock stream with an /M divided oscillator output feedback. At block 606, an error signal is generated indicating whether the IN input is leading or lagging the /M input, with the signal suitably comprising an increase or decrease in voltage to be used to control oscillation. At block 608, the error signal is subjected to charge pump/low pass filtering (CP/LPF), with the signal being smoothed so that the oscillation changes it produces are more gradual. At block 610, the filtered signal is used to control oscillation, suitably by generation of an output frequency that is proportional to the voltage of the filtered signal (applied as an oscillator control input). At block 612, the oscillator output is delivered as an output, suitably by delivery to one or more multiplexers, each multiplexing a plurality of oscillator tap points and feeding a divider. At block 614, the oscillator output is controlled using phase change control, by adjusting multiplexer one phase tap at a time, with the change being made when an oscillator clock edge is not going to be repeated to the output. The phase change control is accomplished through a phase adjustment command, which is determined by accumulating a phase change increment until a maximum is reached. When this maximum is reached, the phase change command is issued, specifying the amount and direction of the phase change increment. At block 616, the oscillator output may also be controlled using a frequency change command, computed by accumulating a frequency offset increment through a until a maximum is reached, with the frequency change command being issued with the opposite direction as the phase adjustment command when the maximum is reached. When the frequency change command is used, the frequency adjustment is included in the summation of the phase change increments. At block 618, implemented if a plurality of control commands are determined, separate control commands are determined (which may be phase change commands, frequency change commands, or both, and which may be independently computed by separate circuits operating simultaneously) commands are queued for submission and acted on in sequence.

The use of a digital frequency synthesis phase lock loop design implemented by the exemplary embodiments discussed above, and by other embodiments of the invention, achieves a number of advantages over a conventional digital analog converter/varactor/quartz oscillator design. These include:

Wider frequency adjustment range

Linear output frequency change

Fine Control Resolution: 20 to 24 bits is the typical limit with analog control; digital control allows for more than 32 bits Gain that is precisely known by design Simpler integration: embodiments can be implemented that can be integrated into existing system elements Multiple independently adjustable outputs from a single reference oscillator.

Quartz resonator assembly process simplification, and reduction of oscillator elements Oscillator thermal stability improvements through removal of varactor from oscillator The DFS-PLL allows functionality that would not have been practical with a traditional PLL/Clock approach. For example, the embodiment illustrated in FIG. 6 and discussed above provides the ability to use an external uncalibrated but stable clock source for one card in a frame so that some functionality can remain operational while the rest of the system is being reset or reconfigured. The DFS-PLL approach enables glitchless clock swap redundancy with no additional local card oscillators. The DFS-PLL allows (for example) for the support of a single oscillator to be the adjusted clock and the unadjusted clock in support of IEEE 1588 phase transfer clocking algorithms, and it enables simplification of Synchronous Ethernet type 1 and 2 operation with their different filter responses which can conflict with other system clock stability requirements.

While various exemplary embodiments have been described above it should be appreciated that the practice of the invention is not limited to the exemplary embodiments shown and discussed here. Various modifications and adaptations to the foregoing exemplary embodiments of this invention may become apparent to those skilled in the relevant arts in view of the foregoing description.

Further, some of the various features of the above non-limiting embodiments may be used to advantage without the corresponding use of other described features.

The foregoing description should therefore be considered as merely illustrative of the principles, teachings and exemplary embodiments of this invention, and not in limitation thereof.

We claim:

1. An apparatus, comprising:
a phase locked loop oscillator circuit comprising:
an oscillator generating a frequency output based on an input signal, wherein the frequency output is fed to a plurality of evenly phase spaced output tap points;
a phase frequency detector supplying the input signal to the oscillator, wherein the input signal indicates the error based on the difference between an input clock signal and a feedback signal;
a plurality of output multiplexers, each of which is driven by the plurality of the tap points, wherein each of the plurality of output multiplexers can be selected as an oscillator frequency output or used as the feedback signal; and
a plurality of phase change control circuits, each determining a phase change command to change a specified output multiplexer to a new tap point by adjusting the specified output multiplexer one phase tap at a time, with the change being made when an oscillator clock edge will not be repeated to an output, wherein each of the plurality of phase change control circuits determines a phase change command by summing a phase increment value at each of a plurality of accumulator clock cycles to compute an accumulated phase increment value over the plurality of accumulator clock cycles and, when the maximum accumulated phase increment value is exceeded, decreasing the accumulated phase increment value by the maximum phase increment value and delivering the phase change command specifying the direction of the phase change, and wherein the phase change commands delivered by the plurality of phase change control circuits are queued for delivery.

2. The apparatus of claim 1, further comprising a frequency offset change control circuit that generates commands that are opposite in direction to the phase change commands, wherein the frequency offset change commands are generated at a different rate than the phase change commands based on an offset increment value, wherein the offset increment value is accumulated over a plurality of accumulator clock cycles by summing an offset increment value every accumulator clock cycle, and, when the maximum accumulated offset value is exceeded, decreasing the accumulated offset value by the maximum offset value and delivering the frequency offset change command, wherein the phase change command accumulator increments using the sum of the phase increment and offset increment values.

3. The apparatus of claim 2, wherein the at least one frequency offset change control circuit comprises a plurality of frequency offset change control circuits, and wherein the phase change commands and the frequency offset change commands are queued for delivery.

4. The apparatus of claim 1, further comprising at least one phase adjustment state machine to align an output clock edge to a specified input reference clock edge, wherein the at least one phase adjustment state machine drives to zero a phase error difference between an original input reference clock edge and an output clock edge, by delivering phase step commands.

5. The apparatus of claim 4, wherein the at least one phase adjustment state machine comprises a plurality of phase adjustment state machines; each adjusting an individual clock output so that each individual output clock selected edge is aligned to a selected input reference clock edge.

6. The apparatus of claim 4, wherein the at least one phase adjustment state machine adjusts a local time reference signal to match a target difference to a specified input time reference.

7. The apparatus of claim 5, wherein each phase adjustment state machine adjusts its local time reference signal to match a target difference to a specified input time reference.

8. The apparatus of claim 1, further comprising a reference frequency adjustment state machine receiving a signal from the reference clock and at least one alternative reference clock, wherein the reference frequency adjustment state machine learns the difference frequency between the input reference clock and the at least one alternative reference clock and adjusts the reference frequency of the at least one alternative input reference clock by the difference frequency to create an adjusted reference frequency closely matching an original reference frequency.

9. The apparatus of claim 8, wherein the at least one alternative input reference clock comprises a plurality of alternative input reference clocks, each producing an alternative reference frequency and wherein the reference frequency adjustment state machine learns the difference frequency between the original reference frequency and each alternative reference frequency and adjusts the alternative reference frequency of a selected one of the alternative input reference clocks to create the adjusted reference frequency closely matching the original reference frequency.

10. The apparatus of claim 2, further comprising a reference frequency adjustment state machine receiving a signal from the reference clock and at least one alternative reference clock, wherein the reference frequency adjustment state machine learns the difference frequency between the input reference clock and the at least one alternative reference clock and adjusts the reference frequency of the at least one alternative input reference clock by the difference frequency to create an adjusted reference frequency closely matching an original reference frequency.

11. The apparatus of claim 1, wherein the oscillator is a fixed frequency oscillator.

12. A method comprising:

generating an oscillator frequency output based on an input signal, wherein the frequency output is fed to a plurality of evenly phase spaced output tap points;

supplying the input signal to an oscillator, wherein the input signal is an error signal based on the difference between an input clock signal and a feedback signal;

multiplexing a plurality of outputs, each of which is driven by the plurality of the tap points, wherein each of the output multiplexers can be selected as the oscillator frequency output or the feedback signal;

determining a plurality of phase change commands and queueing the phase change commands for selection, each phase change command changing a specified output multiplexer to a new tap point by adjusting the specified output multiplexer one phase tap at a time, with the change being made at a time when an oscillator clock edge will not be repeated to an output, wherein determining each phase change command comprises:

computing an accumulated phase increment value by summing a phase increment value over a plurality of accumulator clock cycles until a maximum accumulated phase increment value is exceeded;

when the maximum accumulated phase increment value is exceeded, decreasing the accumulated phase increment value by the maximum phase increment value and delivering the phase change command, with the phase change command specifying the direction of the phase change.

13. The method of claim 12, further comprising a frequency offset change command that is opposite in direction to the phase change commands, wherein the frequency offset change commands are generated at a different rate than the phase change commands based on an offset increment value, wherein the offset increment value is accumulated over a plurality of accumulator clock cycles by summing an offset increment value every accumulator clock cycle, and, when the maximum accumulated offset value is exceeded, decreasing the accumulated offset value by the maximum offset value and delivering the frequency offset change command, wherein the phase change command accumulator increments using the sum of the phase increment and offset increment values.

14. The method of claim 13, further comprising generating a plurality of frequency offset commands and queuing the phase change commands and the frequency offset commands for delivery.

15. The method of claim 12, further comprising aligning an output clock edge to a specified input reference clock edge, wherein the aligning comprises driving to zero a phase error difference between the input reference clock edge and an output clock edge by using phase step commands.

16. The method of claim 15, wherein the aligning comprises adjusting each of a plurality of individual clock outputs so that each individual output clock selected edge is aligned to a selected input reference clock edge.

17. The method of claim 15, further comprising adjusting a local time reference signal to match a target difference to a specified input time reference.

18. The method of claim 16, further comprising adjusting each local time reference signal to match a target difference to a specified input time reference.

19. The method of claim 12, further comprising receiving a signal from the reference clock and at least one alternative reference clock, learning the difference frequency between the input reference clock and the at least one alternative reference clock and adjusting the reference frequency of the at least one alternative input reference clock by the difference frequency to create an adjusted reference frequency closely matching an original reference frequency.

20. The method of claim 19, wherein the at least one alternative input reference clock comprises a plurality of alternative input reference clocks, each producing an alternative reference frequency and further comprising learning the difference frequency between the original reference frequency and each alternative reference frequency and adjusting the alternative reference frequency of a selected one of the alternative input reference clocks to create the adjusted reference frequency closely matching the original reference frequency.

21. The method of claim 13, further comprising receiving a signal from the reference clock and at least one alternative reference clock, learning the difference frequency between the input reference clock and the at least one alternative reference clock and adjusting the reference frequency of the at least one alternative input reference clock by the difference frequency to create an adjusted reference frequency closely matching glean original reference frequency.

22. The method of claim 12, wherein the input signal on which the frequency output is based is a static signal.

* * * * *

UNITED STATES PATENT AND TRADEMARK OFFICE
CERTIFICATE OF CORRECTION

| | | |
|---|---|---|
| PATENT NO. | : 9,148,278 B1 | Page 1 of 1 |
| APPLICATION NO. | : 14/325784 | |
| DATED | : September 29, 2015 | |
| INVENTOR(S) | : Ray et al. | |

It is certified that error appears in the above-identified patent and that said Letters Patent is hereby corrected as shown below:

In the Claims

Claim 21, col. 12, line 45 "glean" should be deleted and --an-- should be inserted.

Signed and Sealed this
Ninth Day of February, 2016

Michelle K. Lee
*Director of the United States Patent and Trademark Office*